(12) United States Patent
Matsushima et al.

(10) Patent No.: US 10,263,121 B2
(45) Date of Patent: Apr. 16, 2019

(54) THIN FILM TRANSISTOR AND METHOD OF MANUFACTURING THIN FILM TRANSISTOR

(71) Applicant: Sakai Display Products Corporation, Osaka (JP)

(72) Inventors: Yoshiaki Matsushima, Osaka (JP); Shigeru Ishida, Osaka (JP); Ryouhei Takakura, Osaka (JP); Satoru Utsugi, Osaka (JP); Nobutake Nodera, Osaka (JP); Takao Matsumoto, Osaka (JP)

(73) Assignee: Sakai Display Products Corporation (JP)

( * ) Notice: Subject to any disclaimer, the term of this patent is extended or adjusted under 35 U.S.C. 154(b) by 0 days.

(21) Appl. No.: 15/923,697

(22) Filed: Mar. 16, 2018

(65) Prior Publication Data
US 2018/0212065 A1    Jul. 26, 2018

Related U.S. Application Data

(63) Continuation-in-part of application No. PCT/JP2015/076592, filed on Sep. 17, 2015.

(51) Int. Cl.
*H01L 29/786* (2006.01)
*H01L 21/02* (2006.01)
(Continued)

(52) U.S. Cl.
CPC .. *H01L 29/78696* (2013.01); *H01L 21/02532* (2013.01); *H01L 21/02592* (2013.01);
(Continued)

(58) Field of Classification Search
CPC .............. H01L 29/6675; H01L 29/786; H01L 27/1274; H01L 21/02356; H01L 29/78696
See application file for complete search history.

(56) References Cited

U.S. PATENT DOCUMENTS

2012/0138942 A1    6/2012 Segawa

FOREIGN PATENT DOCUMENTS

EP    0473988 A1    3/1992
JP    05226656 A  *  9/1993
(Continued)

*Primary Examiner* — Jose R Diaz
(74) *Attorney, Agent, or Firm* — St. Onge Steward Johnston & Reens, LLC

(57) ABSTRACT

Provided are a thin film transistor having properties properly adjusted by adjusting crystallinity of a polycrystalline silicon, and a method of manufacturing the same. The silicon layer functioning as a channel layer of a TFT comprises an amorphous part, a first polycrystalline part and a second polycrystalline part. The first and second polycrystalline parts are formed by irradiating the silicon layer with laser beams (energy beams) through the mask comprising the shielding part for shielding the energy beams, the first transmission part for transmitting the energy beams and the second transmission part for transmitting the energy beams at a transmittance lower than that of the first transmission part. By the presence of the second polycrystalline part, properties of the TFT such as an electron mobility are properly adjusted. Further, properties of the TFT can be adjusted easily by adjusting the configuration of the mask.

4 Claims, 5 Drawing Sheets

(51) Int. Cl.
    *H01L 29/66*     (2006.01)
    *G02F 1/1368*    (2006.01)
    *H01L 27/12*     (2006.01)

(52) U.S. Cl.
    CPC .. *H01L 21/02678* (2013.01); *H01L 29/66765* (2013.01); *H01L 29/786* (2013.01); *H01L 29/78609* (2013.01); *H01L 29/78669* (2013.01); *H01L 29/78678* (2013.01); *G02F 1/1368* (2013.01); *G02F 2202/103* (2013.01); *G02F 2202/104* (2013.01); *H01L 27/1229* (2013.01); *H01L 27/1285* (2013.01)

(56) References Cited

FOREIGN PATENT DOCUMENTS

| | | | |
|---|---|---|---|
| JP | 5226656 | A | 9/1993 |
| JP | 5326554 | A | 12/1993 |
| JP | 6342909 | A | 12/1994 |
| JP | 2008140984 | A | 6/2008 |
| JP | 2010177325 | A | 8/2010 |
| JP | 201129411 | A | 2/2011 |
| JP | 2012114131 | A | 6/2012 |
| WO | 2011161910 | A1 | 12/2011 |

* cited by examiner

THIN FILM TRANSISTOR AND METHOD OF MANUFACTURING THIN FILM TRANSISTOR

BACKGROUND OF THE INVENTION

The present disclosure relates to a thin film transistor, and a method of manufacturing the thin film transistor.

In many cases, thin film transistors (TFTs) have been used in a liquid crystal display panel as active elements for driving pixels. There are TFTs using amorphous silicons and TFTs using polycrystalline silicons as semiconductor. Polycrystalline silicons have larger electron mobilities compared with amorphous silicons. Therefore, in the TFTs using a polycrystalline silicon, a high speed action can be made. On the contrary, since amorphous silicons have smaller mobilities as compared with polycrystalline silicons, the TFTs using amorphous silicons can decrease leakage electric currents when not actuated.

JP 2012-114131 A discloses a TFT using properties of both of an amorphous silicon and a polycrystalline silicon. In this TFT, a gate electrode is formed on an insulating substrate; an insulating layer for covering the substrate and the gate electrode is formed; a polycrystalline silicon layer is formed on the insulating layer; an amorphous silicon layer is formed on the polycrystalline silicon layer; and a source electrode and a drain electrode are formed on the amorphous silicon layer. The polycrystalline silicon layer is formed by irradiating the amorphous silicon with a laser beam to change the amorphous silicon to the polycrystalline silicon after formation of the amorphous silicon. The polycrystalline silicon layer and the amorphous silicon layer function as a channel layer. TFT properties such as an electron mobility are intermediate properties between these in the case of a channel layer having a polycrystalline silicon and these in the case of a channel layer having an amorphous silicon.

Further, a technology of changing a part of an amorphous silicon to a polycrystalline silicon by partially irradiating the amorphous silicon with laser beam but not changing the whole of the amorphous silicon to the polycrystalline silicon has been developed. As compared with the case where the whole of the amorphous silicon is changed to the polycrystalline silicon, a leakage electric current of a TFT can be decreased by changing the part of the amorphous silicon layer to the polycrystalline silicon layer.

SUMMARY OF THE INVENTION

In a TFT in which the whole of an amorphous silicon is changed to a polycrystalline silicon, a leakage electric current is large while an electron mobility is large. Contrarily, in a TFT in which a part of an amorphous silicon is changed to a polycrystalline silicon, a leakage electric current is decreased but an electron mobility is lowered and an action speed becomes low.

The present disclosure has been made in view of such circumstances as mentioned above, and an object of the present disclosure is to provide a thin film transistor having properly adjusted properties by adjusting crystallinity of a polycrystalline silicon, and a method of manufacturing the thin film transistor.

A thin film transistor the present disclosure comprising: a substrate, a gate electrode disposed on the substrate, an insulating layer disposed on the gate electrode, a silicon layer disposed on the insulating layer, and a source electrode and a drain electrode disposed on the silicon layer, wherein the silicon layer comprises an amorphous part comprising an amorphous silicon, a first polycrystalline part comprising a polycrystalline silicon and a second polycrystalline part comprising a polycrystalline silicon having crystallinity lower than that of the first polycrystalline part.

It is preferable that the first polycrystalline part comprises a first region including a part of a region where the source electrode and the silicon layer overlap with each other and a second region including a part of a region where the drain electrode and the silicon layer overlap with each other, and the first region is separated from the second region, and the second polycrystalline part is disposed between the first region and the second region.

It is preferable that end portions of the silicon layer are partialy overlapped with the first region and the second region, and the amorphous part is disposed on the end portions.

A method of manufacturing a thin film transistor of the present disclosure comprising: a step of forming a gate electrode on a substrate, a step of forming a silicon layer comprising an amorphous silicon on the gate electrode, a step of forming a first polycrystalline part comprising a polycrystalline silicon by irradiating a part of the silicon layer with a first energy beam and forming a second polycrystalline part comprising a polycrystalline silicon having crystallinity lower than that of the first polycrystalline part by irradiating a part of other portion of the silicon layer with a second energy beam having an intensity lower than that of the first energy beam, a step of etching the silicon layer so that the first polycrystalline part, the second polycrystalline part and the silicon layer other than the first polycrystalline part and the second polycrystalline part remain un-etched, and a step of forming a source electrode and a drain electrode on the silicon layer.

It is preferable that the first energy beam and the second energy beam comprises transmitted energy beams through a mask comprising a first transmission part and a second transmission part at a transmittance lower than that of the first transmission part, the first energy beam comprises an energy beam transmitted through the first transmission part of the mask, and the second energy beam comprises an energy beam transmitted through the second transmission part of the mask.

In the present disclosure, both of enhancement of the electron mobility and decrease in the leakage electric current can be achieved by properly adjusting the crystallinity of the silicon layer in the TFT. Further, the TFT properties can be adjusted easily by adjusting the configuration of the mask transmitting an energy beam.

DETAILED DESCRIPTION OF THE INVENTION

The present disclosure will be further described below in terms of drawings showing Embodiments of the present disclosure.

(Embodiment 1)

Figure 1:
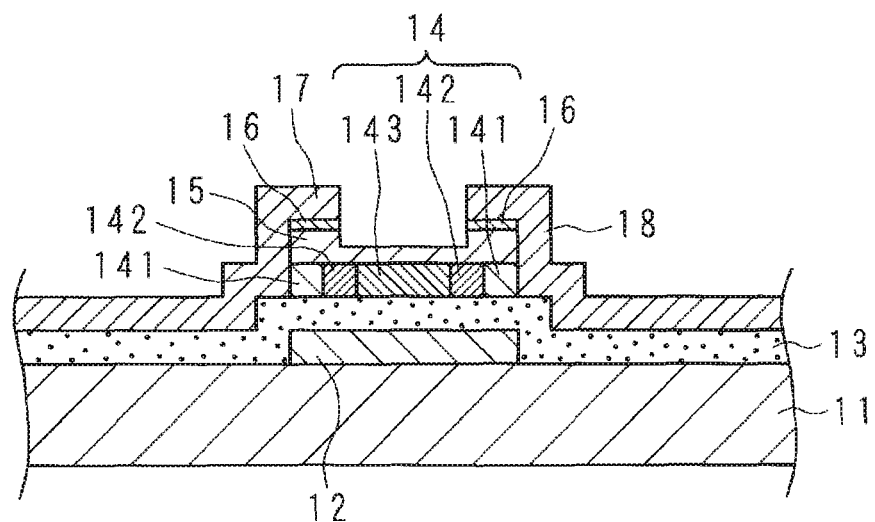
FIG. 1 shows a schematic cross-sectional view showing a principal part of a TFT according to Embodiment 1.

FIG. 1 shows a cross-sectional view schematically showing a principal part of a TFT according to Embodiment 1. A gate electrode 12 is formed on a part of a surface of an insulating substrate 11 such as a glass substrate. A gate insulating film 13 covering the surfaces of the gate electrode 12 and the substrate 11 is formed. The gate insulating film 13 is formed from, for example, silicon nitride. A silicon layer 14 is formed on the gate insulating film 13 over the gate electrode 12. The silicon layer 14 comprises an amorphous part 141 formed from an amorphous silicon, a first polycrystalline part 142 formed from a polycrystalline silicon and a second polycrystalline part 143 formed from a polycrystalline silicon having crystallinity lower than that of the first polycrystalline part 142. Here, "lower crystallinity" means that a ratio of crystallization (a degree of crystallinity) of the second polycrystalline part 143 is smaller than that of the first polycrystalline part 142.

An amorphous silicon layer 15 formed from an amorphous silicon is formed on the surface of the silicon layer 14. An n+Si layer 16 is formed in a predetermined region on the surface of the amorphous silicon layer 15. The n+Si layer 16 is formed from n-type silicon having a high impurity concentration such as phosphorous or arsenic. A source electrode 17 and a drain electrode 18 which have required patterns are formed on the surface of the n+Si layer 16, on side surfaces of the n+Si layer 16, the silicon layer 14 and the amorphous silicon layer 15, and on the surface of the gate insulating film 13. The n+Si layer 16 functions as a contact layer in contact with the source electrode 17 and the drain electrode 18. The silicon layer 14 and the amorphous silicon layer 15 function as a channel layer of the TFT.

Figure 2:
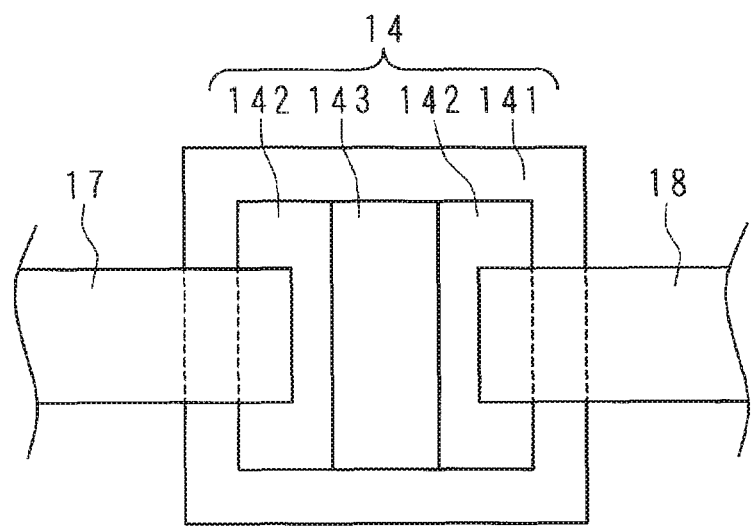
FIG. 2 shows a schematic plan view showing a principal part of a TFT according to Embodiment 1.

FIG. 2 shows a schematic plan view showing a principal part of a TFT according to Embodiment 1. FIG. 2 shows a positional relationship of the silicon layer 14, the source electrode 17 and the drain electrode 18 in a plan view, and the other configurations of the TFT are omitted. The silicon layer 14 is formed in a rectangular shape in a plan view. The first polycrystalline part 142 is formed in two regions (a first region and a second region) of the silicon layer 14, and the two regions 142 are separated in a plan view. The second polycrystalline part 143 is formed between the two regions of the first polycrystalline part 142 in the silicon layer 14. Namely, the second polycrystalline part 143 is formed in such a way as connecting the two regions. The amorphous part 141 is formed at end portion of the silicon layer 14, and in a plan view, is formed so as to surround the first polycrystalline part 142 and the second polycrystalline part 143.

One of the two regions in the first polycrystalline part 142 is formed, in a plan view, so as to be a first region including a part of a region where the source electrode 17 and the silicon layer 14 are overlapping with each other, and another first polycrystalline part 142 is formed, in a plan view, so as to be a second region including a part of a region where the drain electrode 18 and the silicon layer 14 are overlapping with each other. The second polycrystalline part 143 is not formed, in a plan view, in the regions where the source electrode 17 and the drain electrode 18 are overlapping with the silicon layer 14. In a plan view, in the region where the source electrode 17 and the drain electrode 18 are overlapping with the silicon layer 14, the amorphous part 141 is formed in the regions where the first polycrystalline part 142 is not formed.

Figure 3:
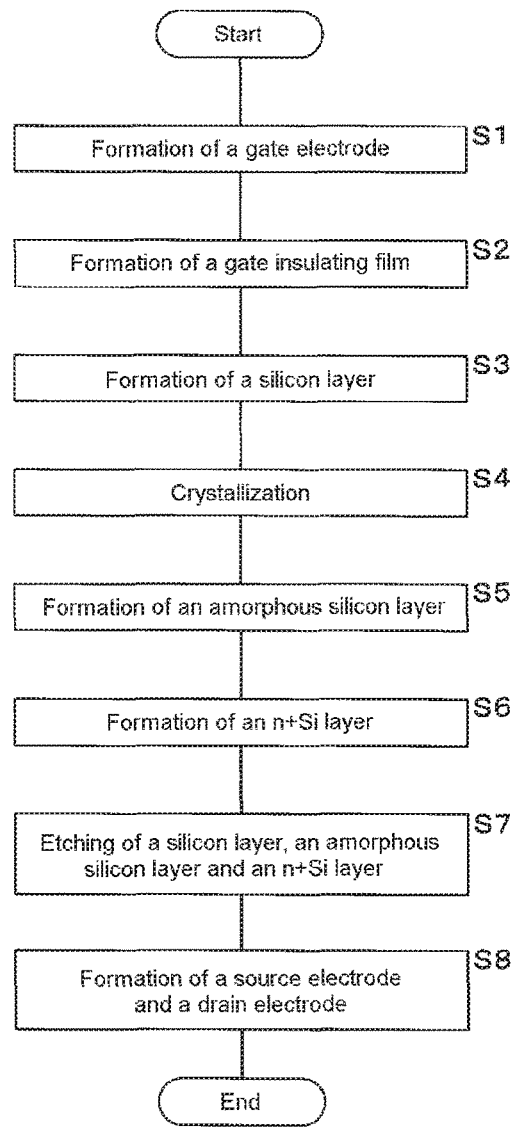
FIG. 3 shows a flow chart showing a manufacturing method of a TFT according to Embodiment 1.
Figure 4:
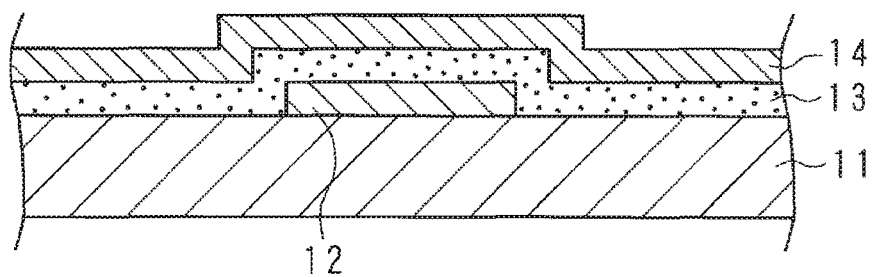
FIG. 4 shows a schematic cross-sectional view showing a part of a manufacturing process of a TFT according to Embodiment 1.

FIG. 3 shows a flow chart showing a manufacturing method of the TFT according to Embodiment 1. FIG. 4, FIG. 5 and FIG. 7 to FIG. 9 show schematic cross-sectional views showing a part of a manufacturing process of the TFT according to Embodiment 1. As shown in FIG. 4, the gate electrode 12 is formed on the substrate 11 (S1), the gate insulating film 13 covering the surfaces of the gate electrode 12 and the substrate 11 is formed (S2), and the silicon layer 14 formed from an amorphous silicon is formed on the surface of the gate insulating film 13 (S3).

Figure 5:
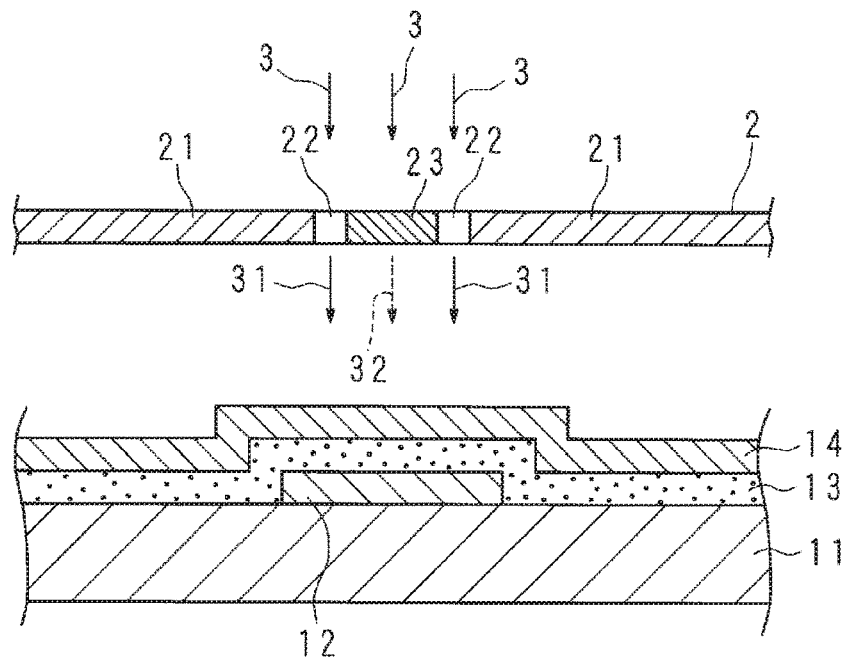
FIG. 5 shows a schematic cross-sectional view showing a part of a manufacturing process of a TFT according to Embodiment 1.

Subsequently, a part of the silicon layer 14 is subjected to crystallization (S4). In order to crystallize the amorphous silicon, the silicon layer 14 is subjected to annealing treatment by irradiating a part of the silicon layer 14 with a laser beam (an energy beam) to raise a temperature of the amorphous silicon by heat of the laser beam, followed by heat releasing. An amorphous silicon in a region irradiated with a laser beam changes to a polycrystalline silicon. For example, an ultraviolet excimer laser to be highly absorbed in an amorphous silicon can be used as this laser beam. FIG. 5 illustrates a method of irradiating the silicon layer 14 with the laser beam 3 (a third energy beam). In the step of S4, the laser beam 3 is irradiated via the mask 2. FIG. 5 shows a schematic cross-sectional view of the mask 2, and the laser beam 3 is shown by arrows. Further, in the step of S4, an optical element such as a lens is used in addition to the mask 2, but in FIG. 5, is not shown.

Figure 6:
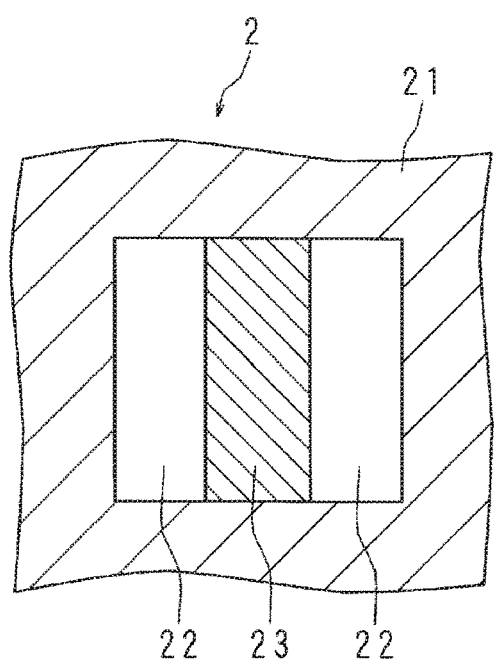
FIG. 6 shows a schematic plan view of a mask.

FIG. 6 shows a schematic plan view of the mask 2. The mask 2 is of planar configuration and comprises a shielding part 21 for shielding the laser beam 3, a first transmission part 22 for transmitting the laser beam 3 and a second transmission part 23 for transmitting the laser beam 3 at a transmittance lower than that of the first transmission part 22. For example, the first transmission part 22 is formed from a transparent material, the second transmission part 23 is formed from one deflecting plate, and the shielding part 21 is formed of two polarizing plates, polarizing directions thereof being crossed at a right angle. As shown in FIG. 6, in a plan view, a shape of the first transmission part 22 is the same as that of the first polycrystalline part 142 shown in FIG. 7, and a shape of the second transmission part 23 is the same as that of the second polycrystalline part 143 shown in FIG. 7. The mask 2 is configured to have the first transmission part 22 and the second transmission part 23 having shapes and sizes allowing an laser beam 31 (a first energy beam) transmitted through the first transmission part 22 shown in FIG. 5 to be irradiated onto the regions where the first polycrystalline part 142 of the silicon layer 14 are formed, and an laser beam 32 (a second energy beam) transmitted through the second transmission part 23 shown in FIG. 5 to be irradiated onto the region where the second polycrystalline part 143 of the silicon layer 14 is formed. In FIG. 5, the first transmission part 22 and the second transmission part 23 have two openings and one opening, respectively.

Figure 7:
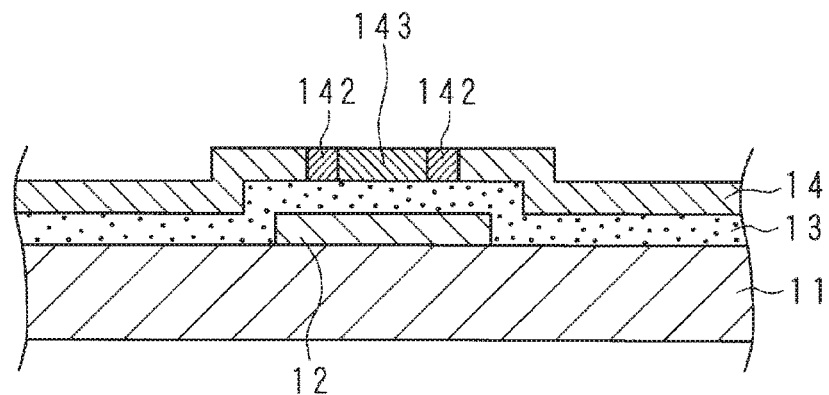
FIG. 7 shows a schematic cross-sectional view showing a part of a manufacturing process of a TFT according to Embodiment 1.

The laser beam 31 transmitted through the first transmission part 22 are irradiated onto the silicon layer 14, and the amorphous silicon of the region irradiated with the laser beam 31 changes to a polycrystalline silicon, thereby forming the first polycrystalline part 142. Namely, the region of the silicon layer 14 irradiated with the laser beam 31 becomes the first polycrystalline part 142. The beam 32 transmitted through the second transmission part 23 is irradiated onto the silicon layer 14, and the amorphous silicon of the region irradiated with the beam 32 changes to a polycrystalline silicon, thereby forming the second polycrystalline part 143. Namely, the region of the silicon layer 14 irradiated with the beam 32 becomes the second polycrystalline part 143. FIG. 7 is a cross-sectional view showing a state of the silicon layer 14 in which the first polycrystalline part 142 and the second polycrystalline part 143 have been formed. Since a transmittance of the laser beam 3 of the second transmission part 23 is smaller than that of the first transmission part 22, an intensity of the beam 32 transmitted through the second transmission part 23 is smaller than that of the laser beam 31 transmitted through the first transmission part 22. Therefore, an raised temperature of the amorphous silicon irradiated with the laser beam 32 is lower, and a crystallization rate of the amorphous silicon is lower than that of the amorphous silicon of the region irradiated with beam 31. Thus, the second polycrystalline part 143 has crystallinity lower than that of the first polycrystalline part 142.

Figure 8:
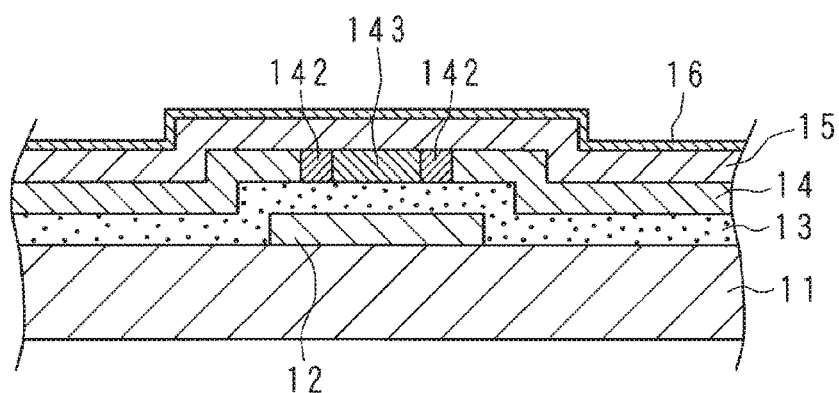
FIG. 8 shows a schematic cross-sectional view showing a part of a manufacturing process of a TFT according to Embodiment 1.
Figure 9:
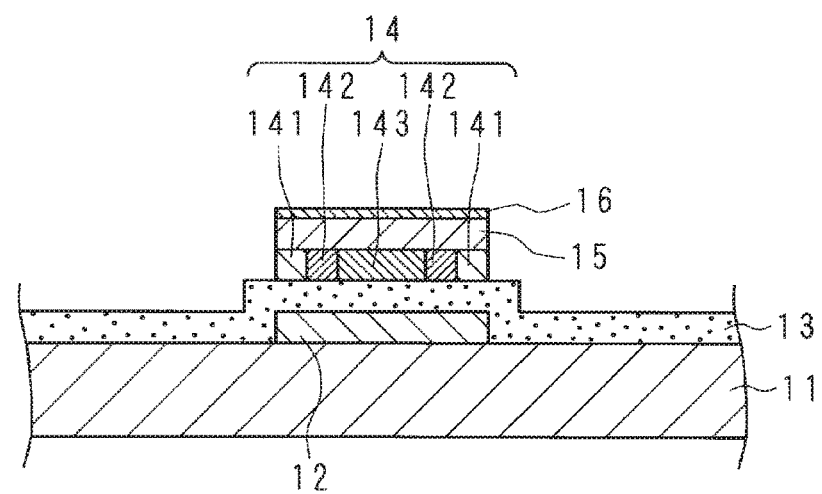
FIG. 9 shows a schematic cross-sectional view showing a part of a manufacturing process of a TFT according to Embodiment 1.

Next, the amorphous silicon layer 15 formed from an amorphous silicon is formed on the surface of the silicon layer 14 (S5). Thereafter, the n+Si layer 16 is formed on the surface of the amorphous silicon layer 15 (S6). FIG. 8 is a cross-sectional view showing a state of the amorphous silicon layer 15 and the n+Si layer 16 having been formed. The amorphous silicon layer 15 covers the silicon layer 14, and the n+Si layer 16 covers the amorphous silicon layer 15. Next, exposure treatment and development treatment are carried out to form a photoresist having a predetermined pattern on the n+Si layer 16, and the silicon layer 14, the amorphous silicon layer 15 and the n+Si layer 16 are subjected to etching to form a predetermined pattern (S7). FIG. 9 is a cross-sectional view showing a state after the etching. In the step of S7, the etching is conducted so that a portion of the silicon layer 14 comprising the amorphous silicon remains un-etched in order to form the amorphous part 141. Next, as shown in FIG. 1, the source electrode 17 and the drain electrode 18 are formed on the n+Si layer 16 (S8), and thus, the TFT is completed.

As described above in detail, in this embodiment, in the TFT, the silicon layer 14 functioning as a channel layer comprises the amorphous part 141, the first polycrystalline part 142 and the second polycrystalline part 143 having crystallinity lower than that of the first polycrystalline part 142. In the second polycrystalline part 143, an electron mobility is larger than that of the amorphous part 141, and smaller than that of the first polycrystalline part 142. By the presence of the second polycrystalline part 143, properties of the TFT such as an electron mobility can be adjusted more properly as compared with a TFT in which a polycrystalline part has one kind of crystallinity.

In this embodiment, the first polycrystalline part 142 is formed in the two regions, that is, the first region including the part of the region in which the source electrode 17 and the silicon layer 14 overlap with each other in a plan view and the second region including the part of the region in which the drain electrode 18 and the silicon layer 14 overlap with each other in a plan view. In the silicon layer 14, the second polycrystalline part 143 is formed in the region between the first region and the second region in first polycrystalline part 142. An electric current flowing between the source electrode 17 and the drain electrode 18 flows through the first polycrystalline part 142 and the second polycrystalline part 143. The two end portions of the silicon layer 14 are partialy overlapped with the silicon layer 14 of the two regions where the source electrode 17 and the drain electrode 18 overlap with the silicon layer 14, and these two end portions of the silicon layer 14 is the amorphous part 141. By allowing the amorphous part 141 to be formed at the end portion of the silicon layer 14, a leakage electric current flowing between the source electrode 17 and the drain electrode 18 is decreased. Therefore, in the TFT according to the embodiment of the present disclosure, a leakage electric current is decreased even though an electron mobility is lowered, as compared with a TFT in which, in a plan view, the two regions where the source electrode 17 and the drain electrode 18 are overlapping with the silicon layer 14 are connected by the first polycrystalline part 142. Further, in the TFT according to the embodiment of the present disclosure, a leakage electric current is increased but an electron mobility is increased as compared with a TFT in which the amorphous part 141 is formed between the two first polycrystalline part 142. Therefore, in this embodiment, an electron mobility and a leakage electric current in the TFT can be adjusted by using two kinds of polysilicon having crystallinity different from each other, and both of improvement of an electron mobility and decrease of a leakage electric current can be achieved.

In this embodiment, the first polycrystalline part 142 and the second polycrystalline part 143 are formed in the silicon layer 14 by irradiating the silicon layer 14 with the laser beam 3 through the mask 2 comprising the shielding part 21, the first transmission part 22 and the second transmission part 23. Positions, shapes and sizes of the first polycrystalline part 142 and the second polycrystalline part 143 in the silicon layer 14 can be adjusted by adjusting positions, shapes and sizes of the first transmission part 22 and the second transmission part 23. Further, crystallinity of the second polycrystalline part 143 can be adjusted by adjusting transmittance of the laser beam 3 in the second transmission part 23. An electron mobility and a leakage electric current in the TFT are determined depending on positions, shapes and sizes of the first polycrystalline part 142 and the second polycrystalline part 143 and crystallinity of the second polycrystalline part 143. Therefore, properties of the TFT can be easily adjusted by adjusting the above-mentioned configuration of the mask 2.

In addition, in this embodiment, while a mode of forming the first polycrystalline part 142 and the second polycrystalline part 143 in the silicon layer 14 using the mask 2 is described above, the first polycrystalline part 142 and the second polycrystalline part 143 can be formed in another way. For example, an output of one kind of laser beam may be changed depending on an irradiating position on the silicon layer 14, and the first polycrystalline part 142 and the second polycrystalline part 143 can be formed. Further, two or more different kinds of laser beams may be used depending on irradiating positions on the silicon layer 14.

(Embodiment 2)

Figure 10:
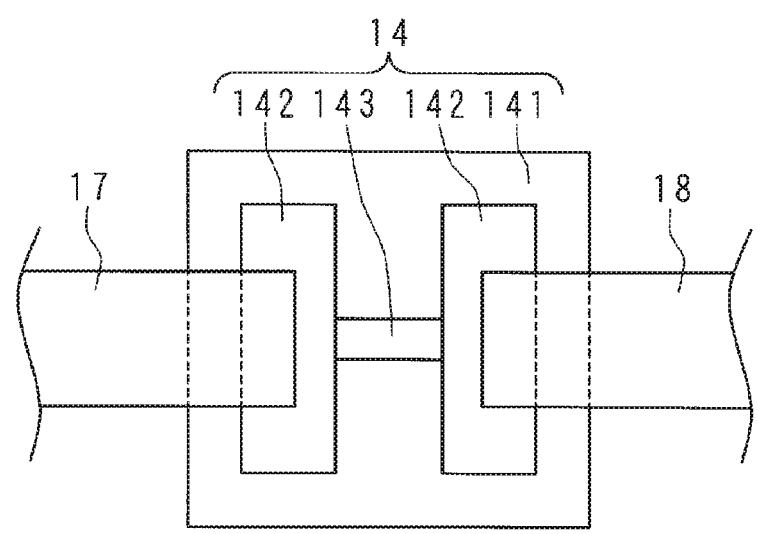
FIG. 10 shows a schematic plan view showing a principal part of a TFT according to Embodiment 2.

Embodiment 2 relates to a mode of another arrangement in the silicon layer 14. FIG. 10 shows a plan view schematically showing principal part of a TFT according to Embodiment 2. A cross-sectional structure of the TFT is the same as in Embodiment 1. FIG. 10 shows a positional relationship, in a plan view, of the silicon layer 14, the source electrode 17 and the drain electrode 18, and other configurations of the TFT are omitted. The first polycrystalline part 142 is formed in two regions (a first region and a second region) of the silicon layer 14, and the two regions of the first polycrystalline part 142 are separated in a plan view. In a plan view, one region of the first polycrystalline part 142 is formed in a first region including a part of a region where the source electrode 17 and the silicon layer 14 are overlapping with each other, and another region of the first polycrystalline part 142 is formed in a second region including a part of a region where the drain electrode 18 and the silicon layer 14 are overlapping with each other.

The second polycrystalline part 143 is formed in between the two regions of first polycrystalline part 142, and connects the two regions of first polycrystalline part 142. Namely, the second polycrystalline part 143 is formed in a region where the two regions of first polycrystalline part 142 are connected. However, in a plan view, the second polycrystalline part 143 is formed so that its width is shorter than the widths of the two regions of the first polycrystalline part 142 in a direction crossing an aligning direction of the source electrode 17 and the drain electrode 18. Namely, this embodiment differs from Embodiment 1 in that the width of the two regions of the second polycrystalline part 143 is smaller in a direction crossing an aligning direction of the source electrode 17 and the drain electrode 18. In the silicon layer 14, the amorphous part 141 is formed on a region other than the first polycrystalline part 142 and the second polycrystalline part 143. Further, in a plan view, the second polycrystalline part 143 is not formed in regions where the source electrode 17 and the drain electrode 18 are overlapping with the silicon layer 14. Among the regions where the source electrode 17 and the drain electrode 18 are overlapping with the silicon layer 14, in the region where the first polycrystalline part 142 are not formed, the amorphous part 141 is formed. The method of manufacturing the TFT is the same as in Embodiment 1.

In this embodiment, as compared with Embodiment 1, a size of the second polycrystalline part 143 is smaller and a size of the amorphous part 141 is larger, and therefore, an electron mobility is lowered somewhat but a leakage electric current is decreased. Thus, properties of the TFT can be adjusted by adjusting positions, shapes and sizes of the first polycrystalline part 142 and the second polycrystalline part 143. Also in this embodiment, the TFT is manufactured using a mask in the same manner as in Embodiment 1. Therefore, also in this embodiment, properties of the TFT can be adjusted easily by adjusting the configuration of the mask.

In addition, the positions, shapes and sizes of the first polycrystalline part 142 and the second polycrystalline part 143 in the silicon layer 14 as described in Embodiments 1 and 2 are examples, and the positions, shapes and sizes of the first polycrystalline part 142 and the second polycrystalline part 143 may be different from those of Embodiment 1 or 2. For example, in Embodiment 1, the regions of the first polycrystalline part 142 and the second polycrystalline part 143 may be changed from each other. Further, while in Embodiments 1 and 2, the laser beams were used for crystallization, energy beam other than the laser beams may be used.

In the present disclosure, the silicon layer functioning as a channel layer of the TFT comprises the amorphous part, the first polycrystalline part and the second polycrystalline part having crystallinity lower than that of the first polycrystalline part. In the second polycrystalline part, its electron mobility is larger than that of the amorphous part and smaller than that of the first polycrystalline part. By the presence of the second polycrystalline part, as compared with a TFT in which a polycrystalline part has one kind of crystallinity, TFT properties such as an electron mobility are properly adjusted. For example, as compared with a TFT comprising no second polycrystalline part, since the size of the first polycrystalline part decreases and the second polycrystalline part is added, the electron mobility is lowered but the leakage electric current is decreased.

In the present disclosure, in the case where in the silicon layer, the first polycrystalline part is disposed, in the plan view, in the two regions comprising the first region including the part of the region where the source electrode and the silicon layer overlaps with each other, and the second region including the part of the region where the drain electrode and the silicon layer overlaps with each other, and the second polycrystalline part is disposed between the two regions in the first polycrystalline part, the electric current flowing between the source electrode and the drain electrode flows through the first polycrystalline part and the second polycrystalline part. Therefore, TFT properties such as an electron mobility are adjusted by the shape, the size, and the crystallinity of the second polycrystalline part.

In the present disclosure, the end portions of the silicon layer are partialy overlapped with the regions where source electrode and the drain electrode overlap with the silicon layer, and in the case where the end portions are the amorphous part, the current flowing between the source electrode and the drain electrode is affected by the properties of the amorphous part.

In the present disclosure, the first polycrystalline part and the second polycrystalline part may be formed in the silicon layer by irradiating the silicon layer with the energy beam via the mask. The mask may have the portion for shielding the energy beam, the portion for transmitting the energy beam and the portion for transmitting the energy beam at the lower transmittance. In that case, the part of the silicon layer which was irradiated with the energy beam transmitted at the lower transmittance becomes the second polycrystalline part. The position, the shape and the size of the first polycrystalline part and the second polycrystalline part are adjusted by adjusting the configuration of the mask.

What is claimed is:

1. A thin film transistor comprising:
   a substrate,
   a gate electrode disposed on the substrate,
   an insulating layer disposed on the gate electrode,
   a silicon layer disposed on the insulating layer, and
   a source electrode and a drain electrode disposed on the silicon layer,
   wherein the silicon layer comprises an amorphous part comprising an amorphous silicon, a first polycrystalline part comprising a polycrystalline silicon and a second polycrystalline part comprising a polycrystalline silicon having crystallinity lower than that of the first polycrystalline part, and
   wherein the first polycrystalline part comprises a first region including a part of a region where the source electrode and the silicon layer overlap with each other and a second region including a part of a region where the drain electrode and the silicon layer overlap with each other, and
   the first region is separated from the second region, and the second polycrystalline part is disposed between the first region and the second region.

2. The thin film transistor of claim 1, wherein end portions of the silicon layer are partially overlapped with the regions where the source electrode and the drain electrode overlap with the silicon layer, and the amorphous part is disposed on the end portions.

3. A method of manufacturing a thin film transistor comprising:
- a step of forming a gate electrode on a substrate,
- a step of forming a silicon layer comprising an amorphous silicon on the gate electrode,
- a step of forming a first polycrystalline part comprising a polycrystalline silicon by irradiating a part of the silicon layer with a first energy beam and forming a second polycrystalline part comprising a polycrystalline silicon having crystallinity lower than that of the first polycrystalline part by irradiating a part of other portion of the silicon layer with a second energy beam having an intensity lower than that of the first energy beam,
- a step of etching the silicon layer so that the first polycrystalline part, the second polycrystalline part and the silicon layer other than the first polycrystalline part and the second polycrystalline part remain un-etched, and
- a step of forming a source electrode and a drain electrode on the silicon layer.

4. The method of manufacturing a thin film transistor of claim 3, wherein
- the first energy beam and the second energy beam comprises transmitted energy beams through a mask comprising a first transmission part and a second transmission part at a transmittance lower than that of the first transmission part,
- the first energy beam comprises an energy beam transmitted through the first transmission part of the mask, and
- the second energy beam comprises an energy beam transmitted through the second transmission part of the mask.

* * * * *